US011534836B2

(12) United States Patent
Yoshimura et al.

(10) Patent No.: US 11,534,836 B2
(45) Date of Patent: Dec. 27, 2022

(54) SURFACE-COATED CUTTING TOOL

(71) Applicant: SUMITOMO ELECTRIC HARDMETAL CORP., Itami (JP)

(72) Inventors: Kouhei Yoshimura, Itami (JP); Haruyo Fukui, Itami (JP); Makoto Setoyama, Itami (JP); Keizo Tanaka, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 222 days.

(21) Appl. No.: 16/955,866

(22) PCT Filed: Jan. 30, 2019

(86) PCT No.: PCT/JP2019/003140
§ 371 (c)(1),
(2) Date: Jun. 19, 2020

(87) PCT Pub. No.: WO2019/181220
PCT Pub. Date: Sep. 26, 2019

(65) Prior Publication Data
US 2020/0331071 A1    Oct. 22, 2020

(30) Foreign Application Priority Data
Mar. 19, 2018    (JP) .............................. JP2018-050918

(51) Int. Cl.
*B23B 27/14* (2006.01)
*B23B 51/00* (2006.01)
(Continued)

(52) U.S. Cl.
CPC ............ *B23B 27/148* (2013.01); *B23B 51/00* (2013.01); *B23C 5/16* (2013.01); *C23C 14/0641* (2013.01); *C23C 14/0664* (2013.01)

(58) Field of Classification Search
CPC ........ B23B 27/14; B23B 27/148; B23C 5/16; C23C 14/0641; C23C 14/0666
(Continued)

(56) References Cited

U.S. PATENT DOCUMENTS 6,811,581 B2 * 11/2004 Yamada ................... C21D 9/22
51/307
2002/0081161 A1    6/2002 Yamada et al.
(Continued)

FOREIGN PATENT DOCUMENTS

EP         3130418 A1    2/2017
JP     2002-137120 A    5/2002
(Continued)

OTHER PUBLICATIONS

Zhang Kedong et al., "Improving dry machining performance of TiAlN hard-coated tools through combined technology of femtosecond laser-textures and WS2 soft-coatings", Journal of Manufacturing Processes, vol. 30, Oct. 24, 2017, pp. 492-501.

*Primary Examiner* — Archene A Turner
(74) *Attorney, Agent, or Firm* — Faegre Drinker Biddle & Reath LLP

(57) ABSTRACT

A surface-coated cutting tool includes: a substrate including a rake face and a flank face; a first coating film that coats the rake face; and a second coating film that coats the flank face, wherein the first coating film includes a first composite nitride layer at a region d1 on the rake face, the second coating film includes a second composite nitride layer at a region d2 on the flank face, the first composite nitride layer includes $Ti_{1-x1-y1}Al_{x1}Ta_{y1}C_{\alpha 1}N_{\beta 1}$, the second composite nitride layer includes $Ti_{1-x2-y2}Al_{x2}Ta_{y2}C_{\alpha 2}N_{\beta 2}$.

7 Claims, 7 Drawing Sheets

(51) Int. Cl.
   *B23C 5/16*      (2006.01)
   *C23C 14/06*     (2006.01)
(58) Field of Classification Search
   USPC .......................................... 428/697, 698, 699
   See application file for complete search history.

(56) References Cited

U.S. PATENT DOCUMENTS

2006/0246320 A1    11/2006  Kathrein et al.
2013/0177361 A1     7/2013  Waki et al.
2017/0029931 A1*    2/2017  Hirano .................... C23C 28/44

FOREIGN PATENT DOCUMENTS

| JP | 2004-042170   | * | 2/2004  |
| JP | 2004-50342  A |   | 2/2004  |
| JP | 2006-224198   | * | 8/2006  |
| JP | 2006-305721 A |   | 11/2006 |
| JP | 2007-015071   | * | 1/2007  |
| JP | 2007-030131 A |   | 2/2007  |
| JP | 2007-105841 A |   | 4/2007  |
| JP | 2008-264975 A |   | 11/2008 |
| JP | 2009-066673 A |   | 4/2009  |
| WO | WO-2012/043459 A1 | | 4/2012 |

* cited by examiner

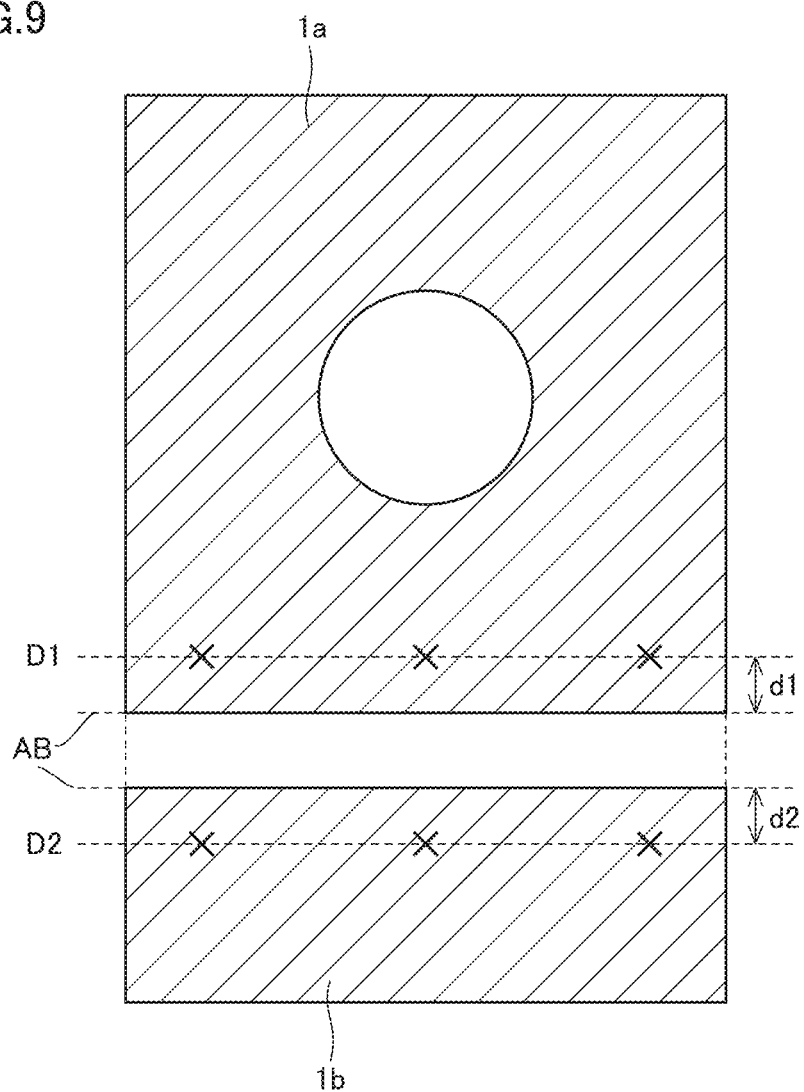

SURFACE-COATED CUTTING TOOL

TECHNICAL FIELD

The present disclosure relates to a surface-coated cutting tool. The present application claims a priority based on Japanese Patent Application No. 2018-050918 filed on Mar. 19, 2018, the entire content of which is incorporated herein by reference.

BACKGROUND ART

Conventionally, various studies have been conducted in order to achieve a long life of a cutting tool. For example, each of Japanese Patent Laying-Open No. 2007-030131 (Patent Literature 1), WO 2012/043459 (Patent Literature 2), and Japanese Patent Laying-Open No. 2009-066673 (Patent Literature 3) discloses a cutting tool including a substrate and a coating film formed on a surface of the substrate.

CITATION LIST

Patent Literature

PTL 1: Japanese Patent Laying-Open No. 2007-030131
PTL 2: WO 2012/043459
PTL 3: Japanese Patent Laying-Open No. 2009-066673

SUMMARY OF INVENTION

A surface-coated cutting tool according to the present disclosure includes:
a substrate including a rake face and a flank face;
a first coating film that coats the rake face; and
a second coating film that coats the flank face, wherein
the first coating film includes a first composite nitride layer at a region d1 on the rake face,
the second coating film includes a second composite nitride layer at a region d2 on the flank face,
the first composite nitride layer includes $Ti_{1-x1-y1}Al_{x1}Ta_{y1}C_{\alpha1}N_{\beta1}$, where each of x1, y1, α1 and β1 represents an atomic ratio, x1 satisfies $0.4 \leq x1 \leq 0.6$, y1 satisfies $0.01 \leq y1 \leq 0.05$, α1 satisfies $0 \leq \alpha1 \leq 0.4$, α1+β1 satisfies $0.8 \leq \alpha1+\beta1 \leq 1.2$,
the second composite nitride layer includes $Ti_{1-x2-y2}Al_{x2}Ta_{y2}C_{\alpha2}N_{\beta2}$, where each of x2, y2, α2 and β2 represents an atomic ratio, x2 satisfies $0.45 \leq x2 \leq 0.65$, y2 satisfies $0.05 \leq y2 \leq 0.1$, α2 satisfies $0 \leq \alpha2 \leq 0.4$, and α2+β2 satisfies $0.8 \leq \alpha2+\beta2 \leq 1.2$,
in a case where the rake face and the flank face are connected via a cutting edge face, the region d1 is a region sandwiched between a boundary line between the rake face and the cutting edge face and an imaginary line D1 located on the rake face and separated by 200 μm from an imaginary ridgeline at which a plane obtained by extending the rake face crosses a plane obtained by extending the flank face, and the region d2 is a region sandwiched between a boundary line between the flank face and the cutting edge face and an imaginary line D2 located on the flank face and separated by 200 μm from the imaginary ridgeline, and
in a case where the rake face and the flank face are connected via a ridgeline, the region d1 is a region sandwiched between the ridgeline and the imaginary line D1 located on the rake face and separated by 200 μm from the ridgeline, and the region d2 is a region sandwiched between the ridgeline and the imaginary line D2 located on the flank face and separated by 200 μm from the ridgeline.

BRIEF DESCRIPTION OF DRAWINGS

FIG. 9 is a schematic view illustrating a measurement location of a rake face or a flank face in X-ray diffraction measurement.

DETAILED DESCRIPTION

Figure 1:
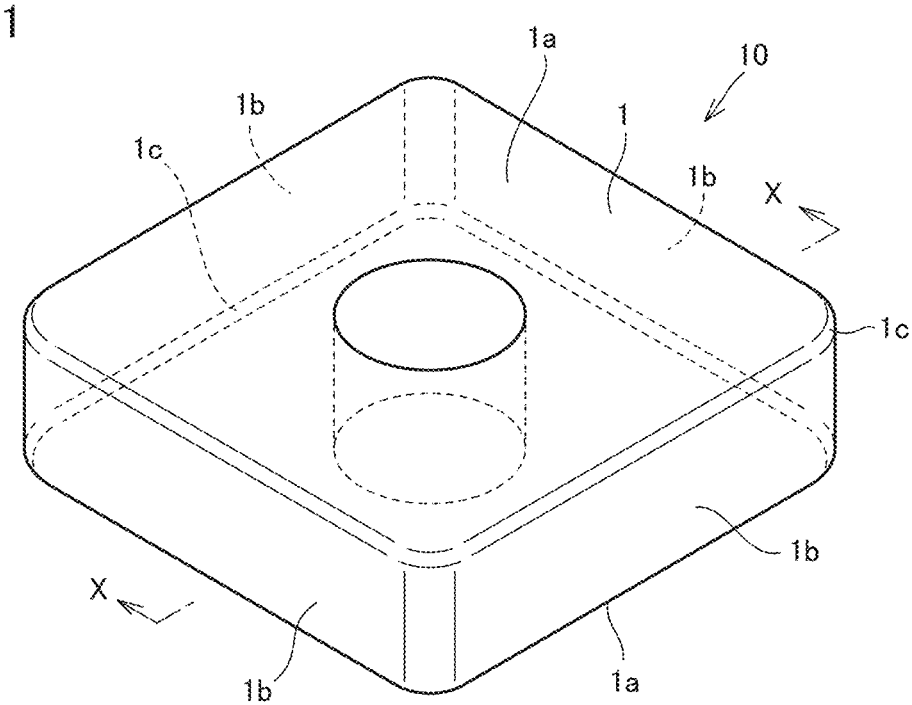
FIG. 1 is a perspective view illustrating one implementation of a cutting tool.

Problem to be Solved by the Present Disclosure

In Patent Literature 1, characteristics (for example, breakage resistance, wear resistance, and the like) of a cutting tool is improved by providing a hard coating film on a surface of a substrate. A rake face and a flank face in the cutting tool are required to have difference characteristics; however, in the cutting tool described in Patent Literature 1, coating films having the same property are provided for the rake face and the flank face. Accordingly, for example, even though the characteristics of the rake face are improved by providing the coating film, the characteristics of the flank face may be insufficient.

On the other hand, in each of Patent Literature 2 and Patent Literature 3, respective coating films having different compositions are provided for a rake face and a flank face of a cutting tool, whereby required characteristics in the rake face and required characteristics in the flank face are improved. However, there is room for further improvement in characteristics of a whole of the cutting tool.

Under such a circumstance, further improvement has been required in a cutting tool having a surface provided with a coating film.

The present disclosure has been made in view of the above-described circumstance, and has an object to provide a surface-coated cutting tool having an excellent breakage resistance and an excellent wear resistance.

Advantageous Effect of the Present Disclosure

According to the description above, there can be provided a surface-coated cutting tool having an excellent breakage resistance and an excellent wear resistance.

Description of Embodiments

First, contents of one embodiment of the present disclosure are listed and described.

[1] A surface-coated cutting tool according to one embodiment of the present disclosure includes:
a substrate including a rake face and a flank face;
a first coating film that coats the rake face; and
a second coating film that coats the flank face, wherein
the first coating film includes a first composite nitride layer at a region d1 on the rake face,
the second coating film includes a second composite nitride layer at a region d2 on the flank face,
the first composite nitride layer includes $Ti_{1-x1-y1}Al_{x1}Ta_{y1}C_{\alpha 1}N_{\beta 1}$, where each of x1, y1, α1 and β1 represents an atomic ratio, x1 satisfies $0.4 \leq x1 \leq 0.6$, y1 satisfies $0.01 \leq y1 \leq 0.05$, α1 satisfies $0 \leq \alpha 1 \leq 0.4$, α1+β1 satisfies $0.8 \leq \alpha 1 + \beta 1 \leq 1.2$,
the second composite nitride layer includes $Ti_{1-x2-y2}Al_{x2}Ta_{y2}C_{\alpha 2}N_{\beta 2}$, where each of x2, y2, α2 and β2 represents an atomic ratio, x2 satisfies $0.45 \leq x2 \leq 0.65$, y2 satisfies $0.05 \leq y2 \leq 0.1$, α2 satisfies $0 \leq \alpha 2 \leq 0.4$, and α2+β2 satisfies $0.8 \leq \alpha 2 + \beta 2 \leq 1.2$,
in a case where the rake face and the flank face are connected via a cutting edge face, the region d1 is a region sandwiched between a boundary line between the rake face and the cutting edge face and an imaginary line D1 located on the rake face and separated by 200 μm from an imaginary ridgeline at which a plane obtained by extending the rake face crosses a plane obtained by extending the flank face, and the region d2 is a region sandwiched between a boundary line between the flank face and the cutting edge face and an imaginary line D2 located on the flank face and separated by 200 μm from the imaginary ridgeline, and
in a case where the rake face and the flank face are connected via a ridgeline, the region d1 is a region sandwiched between the ridgeline and the imaginary line D1 located on the rake face and separated by 200 μm from the ridgeline, and the region d2 is a region sandwiched between the ridgeline and the imaginary line D2 located on the flank face and separated by 200 μm from the ridgeline.

With the above configuration, the surface-coated cutting tool can have both the rake face having an excellent hardness and an excellent toughness and the flank face having an excellent hardness. As a result, the surface-coated cutting tool has an excellent breakage resistance, and has an excellent wear resistance.

[2] y1 satisfies $0.03 \leq y1 \leq 0.05$. By defining in this way, the surface-coated cutting tool has more excellent breakage resistance and wear resistance.

[3] y2 satisfies $0.08 \leq y2 \leq 0.1$. By defining in this way, the surface-coated cutting tool has a more excellent wear resistance.

[4] x1 satisfies $0.4 \leq x1 \leq 0.5$. By defining in this way, the surface-coated cutting tool has more excellent breakage resistance and wear resistance.

[5] x2 satisfies $0.55 \leq x2 \leq 0.65$. By defining in this way, the surface-coated cutting tool has a more excellent wear resistance.

[6] Each of the first coating film and the second coating film has a thickness of more than or equal to 1 μm and less than or equal to 10 μm. By defining in this way, the surface-coated cutting tool has more excellent breakage resistance and wear resistance.

[7] The substrate includes at least one selected from a group consisting of a cemented carbide, a cermet, a high-speed steel, a ceramic, a cBN sintered material, and a diamond sintered material. By defining in this way, the surface-coated cutting tool has excellent hardness and strength at a high temperature.

Details of Embodiments of the Present Disclosure

The following describes one embodiment (hereinafter, referred to as "the present embodiment") of the present disclosure. However, the present embodiment is not limited thereto. It should be noted that the same reference characters indicate the same or equivalent portions in the figures used for the below description of the embodiment. In the present specification, the expression "A to B" represents a range of lower to upper limits (i.e., more than or equal to A and less than or equal to B).

When no unit is indicated for A and a unit is indicated only for B, the unit of A is the same as the unit of B. Further, in the present specification, when a compound is expressed by a chemical formula in which a ratio of composition elements is not limited such as "TiC", it is assumed that the chemical formula includes all the conventionally known compositions (element ratios). In this case, it is assumed that the chemical formula includes not only a stoichiometric composition but also a non-stoichiometric composition. For example, the chemical formula "TiC" includes not only a stoichiometric composition "$Ti_1C_1$" but also a non-stoichiometric composition such as "$Ti_1C_{0.8}$". The same also applies to compounds other than the "TiC".

<<Surface-Coated Cutting Tool>>

A surface-coated cutting tool according to the present embodiment includes:
a substrate including a rake face and a flank face;
a first coating film that coats the rake face; and
a second coating film that coats the flank face, wherein
the first coating film includes a first composite nitride layer at a region d1 on the rake face,
the second coating film includes a second composite nitride layer at a region d2 on the flank face,
the first composite nitride layer includes $Ti_{1-x1-y1}Al_{x1}Ta_{y1}C_{\alpha 1}N_{\beta 1}$, where each of x1, y1, α1 and β1 represents an atomic ratio, x1 satisfies $0.4 \leq x1 \leq 0.6$, y1 satisfies $0.01 \leq y1 \leq 0.05$, α1 satisfies $0 \leq \alpha 1 \leq 0.4$, α1+β1 satisfies $0.8 \leq \alpha 1 + \beta 1 \leq 1.2$,
the second composite nitride layer includes $Ti_{1-x2-y2}Al_{x2}Ta_{y2}C_{\alpha 2}N_{\beta 2}$, where each of x2, y2, α2 and β2 represents an atomic ratio, x2 satisfies $0.45 \leq x2 \leq 0.65$, y2 satisfies $0.05 \leq y2 \leq 0.1$, α2 satisfies $0 \leq \alpha 2 \leq 0.4$, and α2+β2 satisfies $0.8 \leq \alpha 2 + \beta 2 \leq 1.2$,
in a case where the rake face and the flank face are connected via a cutting edge face, the region d1 is a region sandwiched between a boundary line between the rake face and the cutting edge face and an imaginary line D1 located on the rake face and separated by 200 μm from an imaginary ridgeline at which a plane obtained by extending the rake face crosses a plane obtained by extending the flank face, and the region d2 is a region sandwiched between a boundary line between the flank face and the cutting edge face and an imaginary line D2 located on the flank face and separated by 200 μm from the imaginary ridgeline, and in a case where the rake face and the flank face are connected via a ridgeline, the region d1 is a region sandwiched between the ridgeline and the imaginary line D1 located on the rake face and separated by 200 μm from the ridgeline, and the region d2 is a region sandwiched between the ridgeline and the imaginary line D2 located on the flank face and separated by 200 μm from the ridgeline. Here, when $\alpha 1 \neq 0$, the first composite nitride layer can be recognized as a first composite carbonitride layer including a composite carbonitride. Likewise, when $\alpha 2 \neq 0$, the second composite nitride layer can be recognized as a second composite carbonitride layer including a composite carbonitride.

The surface-coated cutting tool (hereinafter, also simply referred to as "cutting tool") of the present embodiment includes the substrate and the coating films (the first coating film and the second coating film) that each coats the substrate. Examples of the above-described cutting tool include a drill, an end mill (for example, a ball end mill), an indexable cutting insert for drill, an indexable cutting insert for end mill, an indexable cutting insert for milling, an indexable cutting insert for turning, a metal saw, a gear cutting tool, a reamer, a tap, and the like.

<Substrate>

For the substrate of the present embodiment, any conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material. The substrate more preferably includes at least one selected from a group consisting of the cemented carbide, the cermet, and the cBN sintered material.

Among these various types of substrates, it is particularly preferable to select the WC-based cemented carbide or the cermet (particularly, the TiCN based cermet). This is due to the following reason: each of these substrates is excellent in balance between hardness and strength particularly at a high temperature, and has an excellent characteristic as a substrate of a surface-coated cutting tool for the above-described purpose of use.

When the cemented carbide is used as the substrate, the effects of the present embodiment are achieved even if the cemented carbide includes free carbon or an abnormal phase called η phase in the structure thereof. It should be noted that the substrate used in the present embodiment may have a modified surface. For example, in the case of the cemented carbide, a β-free layer may be formed on the surface. In the case of the cermet, a surface hardening layer may be formed. Even when the surface is thus modified, the effects of the present embodiment are exhibited.

Moreover, the substrate has the rake face and the flank face. The "rake face" refers to a surface that rakes swarf cut out from a workpiece. The "flank face" refers to a surface having a portion to be brought into contact with a workpiece. Depending on shapes of substrates, the substrates are classified into the following two cases: "a case where the rake face and the flank face are connected via the cutting edge face"; or "a case where the rake face and the flank face are connected via the ridgeline". Hereinafter, an indexable cutting insert (FIGS. 1 to 6) and a rotary tool (FIGS. 7, 8A, and 8B) will be described as specific examples.

(Indexable Cutting Insert)

Figure 2:
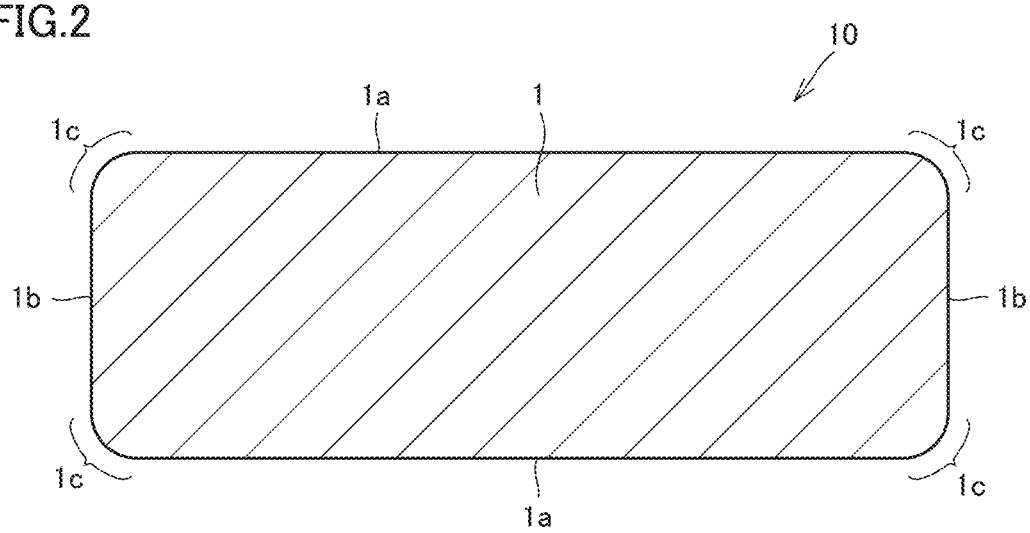
FIG. 2 is a cross sectional view taken along an X-X line of FIG. 1.

FIG. 1 is a perspective view illustrating one implementation of the cutting tool. FIG. 2 is a cross sectional view taken along an X-X line of FIG. 1. The cutting tool having such a shape is used as an indexable cutting insert such as an indexable cutting insert for turning.

Cutting tool 10 shown in FIG. 1 and FIG. 2 has surfaces including an upper surface, a lower surface, and four side surfaces. As a whole, cutting tool 10 has a quadrangular prism shape slightly thin in an upward/downward direction. Moreover, a through hole is formed in cutting tool 10 to extend from the upper surface to the lower surface. At each of boundary portions between the four side surfaces, adjacent side surfaces are connected to each other via an arc surface.

In cutting tool 10, each of the upper surface and the lower surface constitutes rake face 1a, each of the four side surfaces (and the arc surfaces that connect them) constitutes flank face 1b, and each of the arc surfaces that connects rake face 1a and flank face 1b constitutes cutting edge face 1c.

Figure 3:
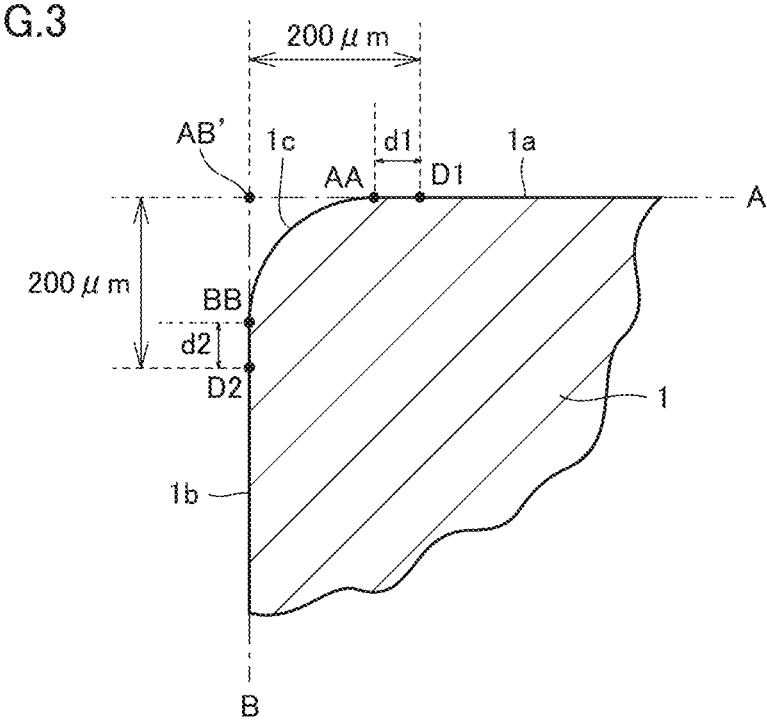
FIG. 3 is a partial enlarged view of FIG. 2.

FIG. 3 is a partial enlarged view of FIG. 2. FIG. 3 shows an imaginary plane A, an imaginary boundary line AA, an imaginary plane B, an imaginary boundary line BB, and an imaginary ridgeline AB'.

Imaginary plane A corresponds to a plane obtained by extending rake face 1a. Boundary line AA is a boundary line between rake face 1a and cutting edge face 1c. Imaginary plane B corresponds to a plane obtained by extending flank face 1b. Boundary line BB is a boundary line between flank face 1b and cutting edge face 1c. Imaginary ridgeline AB' is a line at which the plane (imaginary plane A) obtained by extending rake face 1a crosses the plane (imaginary plane B) obtained by extending flank face 1b. That is, imaginary plane A and imaginary plane B cross each other to form imaginary ridgeline AB'.

In the case shown in FIG. 3, cutting edge face 1c is an arc surface (honing), and rake face 1a and flank face 1b are connected via cutting edge face 1c. Respective portions of rake face 1a and flank face 1b adjacent to cutting edge face 1c and cutting edge face 1c constitute a cutting edge portion of cutting tool 10.

It should be noted that in FIG. 3, imaginary plane A and imaginary plane B are shown in the form of lines, whereas boundary line AA, boundary line BB, and imaginary ridgeline AB' are shown in the form of dots.

Figure 4:
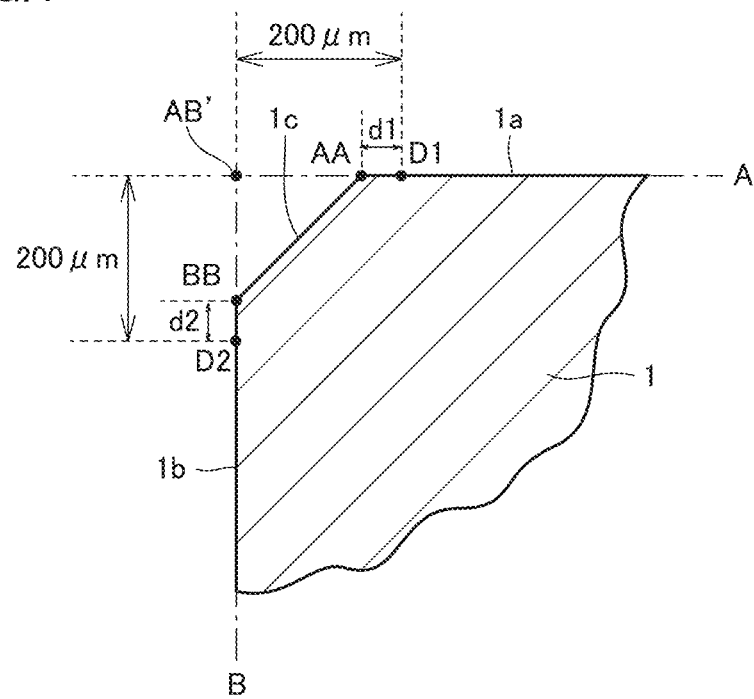
FIG. 4 illustrates another shape of a cutting edge face.

Although FIG. 1 to FIG. 3 show the case where cutting edge face 1c is an arc surface (honing), the shape of cutting edge face 1c is not limited to this. For example, as shown in FIG. 4, cutting edge face 1c may have a flat shape (negative land). Moreover, as shown in FIG. 5, cutting edge face 1c may have a shape including both a flat surface and an arc surface (a shape in combination with the honing and the negative land).

Figure 5:
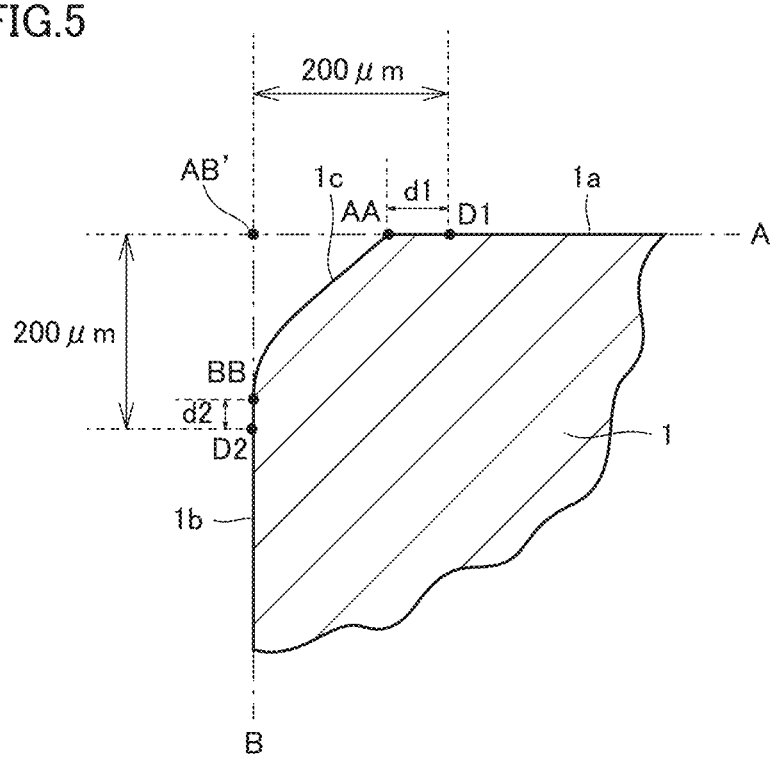
FIG. 5 illustrates still another shape of the cutting edge face.

As with the case shown in FIG. 3, also in each of the cases shown in each of FIG. 4 and FIG. 5, rake face 1a and flank face 1b are connected via cutting edge face 1c, and imaginary plane A, boundary line AA, imaginary plane B, boundary line BB, and imaginary ridgeline AB' are set.

That is, each of the cases shown in FIG. 3 to FIG. 5 is included in the "case where the rake face and the flank face are connected via the cutting edge face".

When substrate 1 has the shape shown in each of FIG. 3 to FIG. 5 as described above, cutting edge face 1c can be determined only from the shape. This is because cutting edge face 1c in this case is not included in either of imaginary plane A and imaginary plane B, and can be discriminated through an visual observation on rake face 1a and flank face 1b.

Cutting edge face 1c is generally a surface of substrate 1, and may include a surface formed by performing a machining process onto a ridge between crossing surfaces. In other words, substrate 1 is obtained by providing a machining process onto at least a portion of a surface of a substrate precursor composed of a sintered material or the like. Cutting edge face 1c may include a surface formed by beveling through a machining process.

Figure 6:
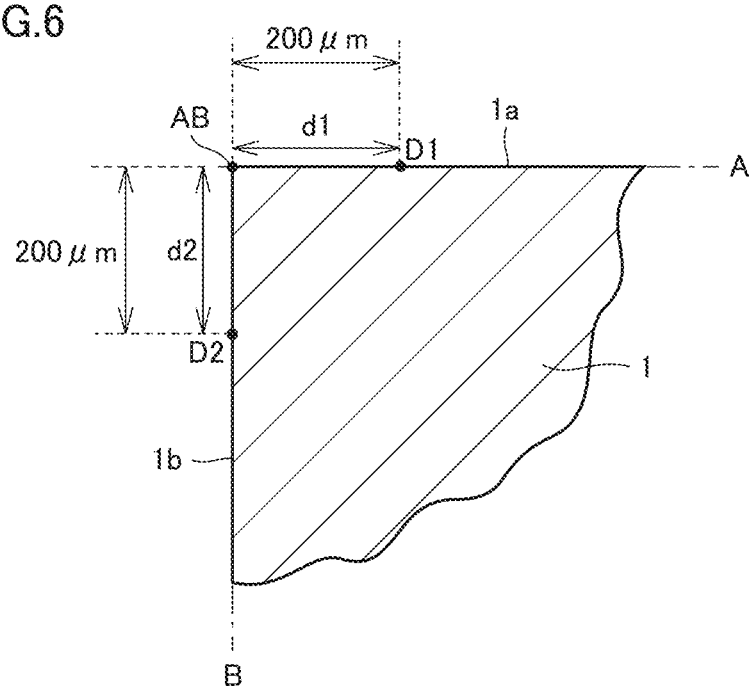
FIG. 6 illustrates yet another shape of the cutting edge face.

On the other hand, a case where substrate 1 has a sharp edge shape as shown in FIG. 6 is included in "the case where the rake face and the flank face are connected via the ridgeline".

In the case shown in FIG. 6, no cutting edge face 1c shown in FIG. 3 to FIG. 5 exists, and rake face 1a and flank face 1b are adjacent to each other. Moreover, a boundary line between rake face 1a and flank face 1b constitutes ridgeline AB, and ridgeline AB and respective portions of rake face 1a and flank face 1b adjacent to ridgeline AB constitute the cutting edge portion of cutting tool 10.

(Rotary Tool)

Figure 7:
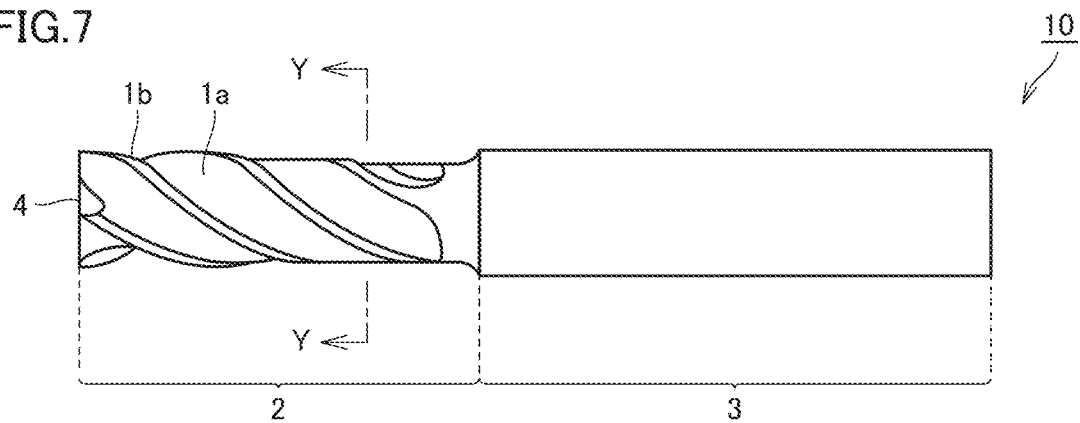
FIG. 7 is a schematic plan view illustrating a rotary tool, which is another implementation of the cutting tool.
Figure 8A:
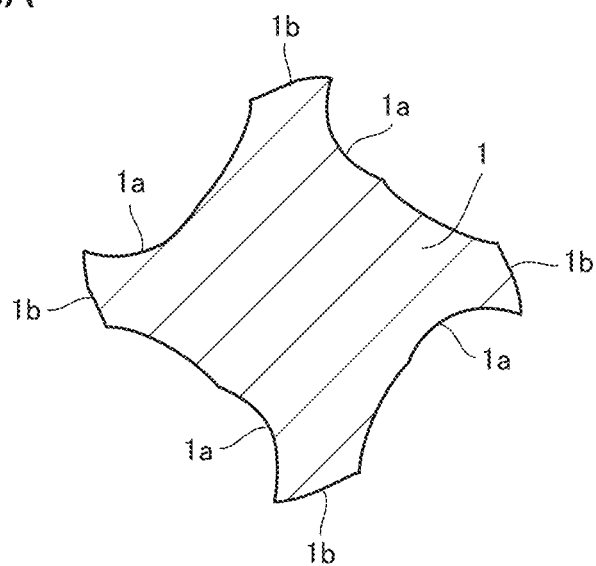
FIG. 8A is a cross sectional view taken along a Y-Y line shown in FIG. 7.
Figure 8B:
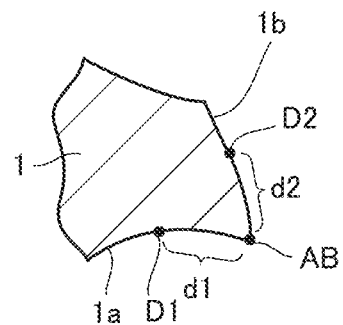
FIG. 8B is a partial enlarged view of FIG. 8A.

FIG. 7 is a schematic plan view illustrating a rotary tool, which is another implementation of the cutting tool. FIG. 8A is a cross sectional view taken along a Y-Y line shown in FIG. 7. FIG. 8B is a partial enlarged view of FIG. 8A. In the present embodiment, an end mill having four cutting edges is illustrated as such a rotary tool. Examples of another implementation of such a rotary tool includes a drill.

The rotary tool serving as cutting tool 10 includes: substrate 1 serving as a main body of the rotary tool; and the coating films (the first coating film and the second coating film; not shown) that each coat the surface of substrate 1 (FIG. 7 and FIG. 8A). Part or whole of the surface of substrate 1 included in the rotary tool may be coated with the coating films. A surface of substrate 1 constituting a shank 3 may not be coated with the coating films and only a surface of substrate 1 constituting a cutting portion 2 may be coated with the coating films, for example.

Substrate 1 defines the shape of the main body of the rotary tool. Substrate 1 includes cutting portion 2 and shank 3. Cutting portion 2 includes an outer circumference portion 1b (corresponding to flank face 1b), a groove portion 1a (corresponding to rake face 1a), and an end cutting edge portion 4 (FIG. 7). Outer circumference portion 1b and groove portion 1a are connected via ridgeline AB (FIG. 8B). Outer circumference portion 1b and end cutting edge portion 4 are regions for cutting a workpiece, whereas groove portion 1a is a region for bringing, to outside, swarf resulting from cutting. Particularly, outer circumference portion 1b includes a portion having no relief angle with respect to a workpiece.

In the description above, the shape of substrate 1 and the respective names of the portions thereof have been described with reference to FIGS. 1 to 7, 8A and 8B. The same terms as those described above will be used for shape and names of portions corresponding to the substrate in the surface-coated cutting tool according to the present embodiment. That is, the above-described surface-coated cutting tool has a rake face and a flank face. For example, it is understandable that the expression "the surface-coated cutting tool has a rake face" encompasses a state in which the rake face of the substrate is coated with the first coating film. Moreover, it is understandable that the expression "the surface-coated cutting tool has a flank face" encompasses a state in which the flank face of the substrate is coated with the second coating film.

<First Coating Film>

Figure 12A:
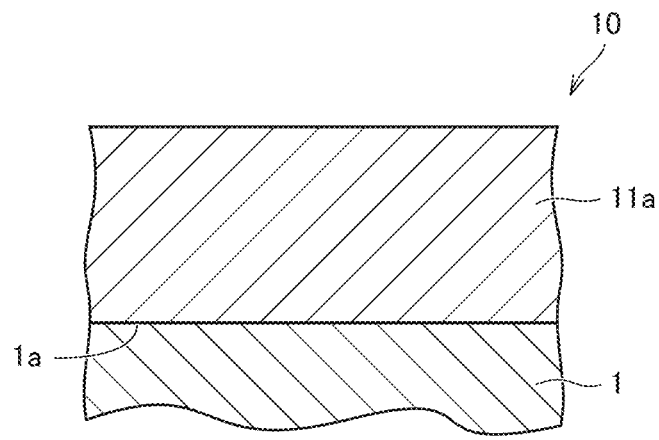
FIG. 12A is a schematic partial cross sectional view of the rake face of the surface-coated cutting tool in one implementation of the present embodiment.

In the present embodiment, first coating film 11a coats rake face 1a (FIG. 12A). More specifically, the "first coating film" coats at least a portion of the rake face in the substrate. The first coating film preferably coats the entire surface of the rake face. However, a first coating film that does not coat a portion of the rake face and a coating film having a partially different configuration are not deviated from the scope of the present embodiment.

The first coating film includes a first composite nitride layer at a region d1 on rake face 1a. In one aspect of the present embodiment, the first coating film may be constituted of the first composite nitride layer at region d1. In another aspect of the present embodiment, the first coating film may be constituted of the first composite nitride layer and one or more other layers at region d1. The "other layer(s)" will be described later.

Here, in "the case where rake face 1a and flank face 1b are connected via cutting edge face 1c" as shown in FIG. 3 to FIG. 5, region d1 is a "region sandwiched between boundary line AA between rake face 1a and cutting edge face 1c and an imaginary line D1 located on rake face 1a and separated by 200 μm from imaginary ridgeline AB'".

On the other hand, in "the case where rake face 1a and flank face 1b are connected via ridgeline AB" as shown in FIG. 6, region d1 is a "region sandwiched between ridgeline AB and imaginary line D1 located on rake face 1a and separated by 200 μm from ridgeline AB".

Here, the first coating film in the present embodiment may include the first composite nitride layer at not only region d1 but also a region of the rake face other than region d1. For example, the first coating film may include the first composite nitride layer at the whole of the rake face. In one aspect of the present embodiment, the first coating film may include one or more other layers at the region other than region d1. The "first composite nitride layer" will be described later.

The first coating film preferably has a thickness of more than or equal to 1 μm and less than or equal to 10 μm, and more preferably has a thickness of more than or equal to 1 μm and less than or equal to 6 μm. The thickness of the first coating film can be found using a method employing a scanning electron microscope (SEM), for example. More specifically, first, measurement is performed at arbitrary three points at the first coating film in a cross sectional sample parallel to the normal direction of the surface of the substrate. Next, by calculating an average value of the measured thicknesses at the three points, the thickness of the first coating film is found. The same applies to the respective thicknesses of the first composite nitride layer, the second coating film, and the second composite nitride layer, which will be described later. Examples of the scanning electron microscope include JSM-IT300 (trademark) provided by JEOL, and the like.

(First Composite Nitride Layer)

The first composite nitride layer includes $Ti_{1-x1-y1}Al_{x1}Ta_{y1}C_{\alpha1}N_{\beta2}$. Here, each of x1, y1, α1, and β1 represents an atomic ratio, and x1 satisfies $0.4 \leq x1 \leq 0.6$, y1 satisfies $0.01 \leq y1 \leq 0.05$, α1 satisfies $0 \leq \alpha1 \leq 0.4$, α1+β1 satisfies $0.8 \leq \alpha1+\beta1 \leq 1.2$. The first composite nitride layer may include an inevitable impurity as long as the effects exhibited by the surface-coated cutting tool according to the present embodiment are not compromised. The content ratio of the inevitable impurity is preferably more than or equal to 0 mass % and less than or equal to 1 mass % relative to the total mass of the first composite nitride layer.

The composition of the first composite nitride layer can be found by performing energy dispersive X-ray analysis (EDX analysis) under below-described conditions, for example. Specifically, first, when substrate 1 (i.e., cutting tool 10) is an indexable cutting insert having a sharp edge shape as shown in FIG. 6, EDX measurement is performed onto arbitrary three points (for example, FIG. 9) in region d1 sandwiched between ridgeline AB and imaginary line D1 separated by 200 μm from ridgeline AB. Then, respective average values of atom % of Al, Ti, and Ta are found. Next, based on the found average values of atom %, respective composition ratios of Al, Ti, and Ta are found. For example, the composition ratio of Al can be found by a below-described formula (1). In the formula (1), $M_{Al}$ represents the average value of atom % of Al, $M_{Ti}$ represents the average value of atom % of Ti, and $M_{Ta}$ represents the average value of atom % of Ta. For each of the other metal elements Ti and Ta, the composition ratio can be found in a similar manner.

Composition ratio of Al=$M_{Al}/(M_{Al}+M_{Ti}+M_{Ta})$   Formula (1)

Moreover, the composition ratio of each of nonmetal elements N and C in the first composite nitride layer can be also found by the above-described method.

Examples of the above-described EDX apparatus include JED-2300 Analysis Station Plus (trademark) provided by JEOL.

The composition ratio of each of the elements found based on the above-described method is regard as the composition ratio of each of the elements at region d1 of rake face 1a (FIG. 9). In FIG. 9, the selected three arbitrary points are on imaginary line D1; however, any three points in region d1 may be selected. Here, the "three arbitrary points" are selected from different crystal grains in the first composite nitride layer. When substrate 1 has a shape as shown in each of FIGS. 3 to 5, EDX measurement is performed at these three arbitrary points in region d1 sandwiched between boundary line AA and imaginary line D1, and the average value of atom % of each element found at these three arbitrary points is regarded as atom % of the element in region d1 of the rake face. Moreover, the composition ratio found based on atom % of each element is regarded as the composition ratio in region d1 of the rake face.

Even when the cutting tool is a rotary tool as shown in FIG. 7, the composition of the first composite nitride layer can be found by the method described above. On this occasion, region d1 of rake face 1a is specified based on a cross section along a plane perpendicular to the rotation axis of the rotary tool (FIG. 8A). That is, region d1 can be recognized as a region sandwiched between ridgeline AB and imaginary line D1 separated by 200 μm from ridgeline AB along the surface of groove portion 1a (FIG. 8B).

(Conditions of EDX Measurement)
Acceleration voltage: 15 kV
Illumination current: 70 μA
Elements to be measured: Al, Ti, Ta, C, and N
Number of times of performing integration: 20 times In the first composite nitride layer, x1 satisfies $0.4 \leq x1 \leq 0.6$, preferably satisfies $0.4 \leq x1 \leq 0.5$, and more preferably satisfies $0.45 \leq x1 \leq 0.5$. Since x1 falls within the above-described range, a wear resistance such as a crater wear resistance is improved. On the other hand, where x1 is less than 0.4, an oxidation resistance tends to be decreased.

In the first composite nitride layer, y1 satisfies $0.01 \leq y1 \leq 0.05$, preferably satisfies $0.03 \leq y1 \leq 0.05$, and more preferably satisfies $0.03 \leq y1 \leq 0.04$. Since y1 falls within the above-described range, high-temperature hardness of the first composite nitride layer is increased, with the result that a wear resistance such as a crater wear resistance is improved. On the other hand, when y1 is more than 0.05, compressive stress of the first composite nitride layer is decreased, with the result that chipping such as film chipping tends to be likely to occur.

In the first composite nitride layer, α1 satisfies $0 \leq \alpha1 \leq 0.4$, preferably satisfies $0 \leq \alpha1 \leq 0.3$, and more preferably satisfies $0 \leq \alpha1 \leq 0.2$. Here, when $\alpha1 \neq 0$, the first composite nitride layer can be recognized as a first composite carbonitride layer including a composite carbonitride.

In the first composite nitride layer, β1 preferably satisfies $0.4 \leq \beta1 \leq 1.2$, and more preferably satisfies $0.8 \leq \beta1 \leq 1.2$.

In the first composite nitride layer, α1+β1 satisfies $0.8 \leq \alpha1+\beta1 \leq 1.2$, preferably satisfies $0.85 \leq \alpha1+\beta1 \leq 1.15$, and more preferably satisfies $0.9 \leq \alpha1+\beta1 \leq 1.1$.

The first composite nitride layer preferably has a thickness of more than or equal to 1 μm and less than or equal to 8 μm, and more preferably has a thickness of more than or equal to 1 μm and less than or equal to 6 μm. The thickness of the first composite nitride layer can be found in the same manner as described above, for example, by the method employing a SEM.

<Second Coating Film>

Figure 12B:
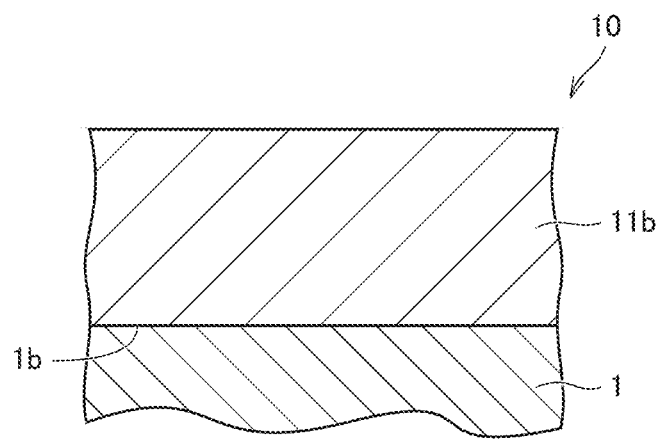
FIG. 12B is a schematic partial cross sectional view of the flank face of the surface-coated cutting tool in one implementation of the present embodiment.

In the present embodiment, second coating film 11b coats flank face 1b (FIG. 12B). More specifically, "the second coating film" coats at least a portion of the flank face in the substrate. The second coating film preferably coats the entire flank face. However, a second coating film that does not coat a portion of the flank face and a coating film having a partially different configuration are not deviated from the scope of the present embodiment.

The second coating film includes a second composite nitride layer at a region d2 on flank face 1b. In one aspect of the present embodiment, the second coating film may be constituted of the second composite nitride layer in region d2. In another aspect of the present embodiment, the second coating film may be constituted of the second composite nitride layer and one or more other layers in region d2. The "other layer(s)" will be described later.

Here, in "the case where rake face 1a and flank face 1b are connected via cutting edge face 1c" as shown in FIG. 3 to FIG. 5, region d2 is a "region sandwiched between boundary line BB between flank face 1b and cutting edge face 1c and an imaginary line D2 located on flank face 1b and separated by 200 μm from imaginary ridgeline AB'".

On the other hand, in "the case where rake face 1a and flank face 1b are connected via ridgeline AB" as shown in FIG. 6, region d2 is a "region sandwiched between ridgeline AB and imaginary line D2 located on flank face 1b and separated by 200 μm from ridgeline AB".

Here, the second coating film in the present embodiment may include the second composite nitride layer at not only region d2 but also a region of the flank face other than region d2. For example, the second coating film may include the second composite nitride layer at the whole of the flank face. In one aspect of the present embodiment, the second coating film may include one or more other layers at the region other than region d2. The "second composite nitride layer" will be described later.

The second coating film preferably has a thickness of more than or equal to 1 μm and less than or equal to 10 μm, more preferably has a thickness of more than or equal to 1 μm and less than or equal to 8 μm, and further preferably has a thickness of more than or equal to 1 μm and less than or equal to 6 µm. The thickness of the second coating film can be found in the same manner as described above, for example, by the method employing a SEM.

(Second Composite Nitride Layer) The second composite nitride layer includes $Ti_{1-x2-y2}Al_{x2}Ta_{y2}C_{\alpha 2}N_{\beta 2}$. Here, each of x2, y2, α2, and β2 represents an atomic ratio, and x2 satisfies 0.45≤x2≤0.65, y2 satisfies 0.05<y2≤0.1, α2 satisfies 0≤α2≤0.4, and α2+β2 satisfies 0.8≤α2+β2≤1.2. The second composite nitride layer may include an inevitable impurity as long as the effects exhibited by the surface-coated cutting tool according to the present embodiment are not compromised. The content ratio of the inevitable impurity is preferably more than or equal to 0 mass % and less than or equal to 1 mass % relative to the total mass of the second composite nitride layer.

The composition of the second composite nitride layer can be found in the same manner as described in the above-described section (First Composite Nitride Layer).

Also when the cutting tool is a rotary tool as shown in FIG. 7, the composition of the second composite nitride layer can be found by the above-described method. On this occasion, region d2 of flank face 1b is specified based on a cross section taken along a plane perpendicular to the rotation axis of the rotary tool (FIG. 8A). That is, region d2 can be recognized as a region sandwiched between ridgeline AB and imaginary line D2 separated by 200 µm from ridgeline AB along the surface of outer circumference portion 1b (FIG. 8B).

In the second composite nitride layer, x2 satisfies 0.45≤x2≤0.65, preferably satisfies 0.55≤x2≤0.65, and more preferably satisfies 0.55≤x2≤0.6. When x2 falls within the above-described range, the hardness of the second composite nitride layer is increased, with the result that the wear resistance such as a flank face wear resistance is improved. On the other hand, when x2 is more than 0.65, a crystal structure in the second composite nitride layer becomes hexagonal, with the result that the hardness tends to be decreased.

In the second composite nitride layer, y2 satisfies 0.05<y2≤0.1, preferably satisfies 0.08≤y2≤0.1, and more preferably satisfies 0.08≤y2≤0.09. When y2 falls within the above-described range, the hardness and high-temperature hardness of the second composite nitride layer are improved, with the result that the wear resistance such as a flank face wear resistance is improved. On the other hand, when y2 is more than 0.1, the hardness of the second composite nitride layer is increased too much, with the result that chipping such as film chipping tends to be likely to occur.

In the second composite nitride layer, α2 satisfies 0≤α2≤0.4, preferably satisfies 0≤α2≤0.3, and more preferably satisfies 0≤α2≤0.2. Here, when α2≠0, the second composite nitride layer can be recognized as a second composite carbonitride layer including a composite carbonitride.

In the second composite nitride layer, β2 preferably satisfies 0.4<β2≤1.2, and more preferably satisfies 0.8≤β2≤1.2.

In the second composite nitride layer, α2+β2 satisfies 0.8≤α2+β2≤1.2, preferably satisfies 0.85≤α2+β2≤1.15, and more preferably satisfies 0.9≤α2+β2≤1.1.

The thickness of the second composite nitride layer is preferably more than or equal to 1 µm and less than or equal to 8 µm, and is more preferably more than or equal to 1 µm and less than or equal to 6 µm. The thickness of the second composite nitride layer can be found in the same manner as described above, for example, by the method employing a SEM.

(Other Layer(s))

As long as the effects of the present embodiment are not compromised, each of the first coating film and the second coating film may further include other layer(s). Examples of the other layer(s) include a TiN layer (a layer composed of a compound represented by TiN; the same applies to the description below), a TiBNO layer, a TiCNO layer, a $TiB_2$ layer, a TiAlN layer, a TiAlCN layer, a TiAlON layer, a TiAlONC layer, an $Al_2O_3$ layer, and the like. It should be noted that an order of layering the other layer(s) is not particularly limited. For example, the other layer(s) may be formed between the substrate and the first composite nitride layer, or may be formed on the first composite nitride layer. In other words, the first composite nitride layer may be an outermost layer in the first coating film. Moreover, the other layer(s) may be formed between the substrate and the second composite nitride layer, or may be formed on the second composite nitride layer. In other words, the second composite nitride layer may be an outermost layer in the second coating film.

<<Method for Manufacturing Surface-Coated Cutting Tool>>

A method for manufacturing the surface-coated cutting tool according to the present embodiment includes:

a substrate preparing step of preparing the substrate;

a first coating step of coating at least a portion of the rake face with the first composite nitride layer; and a second coating step of coating at least a portion of the flank face with the second composite nitride layer. Hereinafter, each of the steps will be described.

<Substrate Preparing Step>

In the substrate preparing step, the substrate is prepared. As the substrate, any conventionally known substrate for such a purpose of use can be used as described above. For example, when the substrate is composed of a cemented carbide, first, source material powders having predetermined blending compositions (mass %) are uniformly mixed using a commercially available attritor, then, this powder mixture is pressed and formed into a predetermined shape (for example, a shape represented by CNMG120408NUX, a shape represented by GSXB20300, or the like). Then, the formed body of the source material powders is sintered for 1 to 2 hours at 1300 to 1500° C. in a predetermined sintering furnace, whereby the above-described substrate composed of a cemented carbide can be obtained. Moreover, a commercially available product may be used for the substrate without modification.

<First Coating Step>

In the first coating step, at least a portion of the rake face is coated with the first composite nitride layer. Here, the expression "at least a portion of the rake face" includes region d1 located on rake face 1a and sandwiched between ridgeline AB at which rake face 1a crosses flank face 1b and imaginary line D1 separated by 200 µm from ridgeline AB (for example, FIG. 6).

In one aspect of the present embodiment, the expression "at least a portion of the rake face" includes region d1 located on rake face 1a and sandwiched between boundary line AA between rake face 1a and cutting edge face 1c and imaginary line D1 separated by 200 µm from imaginary ridgeline AB' at which imaginary plane A including rake face 1a crosses imaginary plane B including flank face 1b (for example, FIG. 3 to FIG. 5).

A method for coating at least a portion of the rake face with the first composite nitride layer is not limited particularly; however, the first composite nitride layer can be formed by a physical vapor deposition method (PVD method), for example.

As the physical vapor deposition method, a conventionally known physical vapor deposition method can be used without a particular limitation. Examples of such a physical vapor deposition method can include a sputtering method, an ion plating method, an arc ion plating method, an electron ion beam deposition method, and the like. When the cathode arc ion plating method or sputtering method involving a particularly high ionization rate of a material element is used, a metal or gas ion bombardment process can be performed onto the surface of the substrate before forming the coating film. This is preferable because adhesion between the coating film and the substrate is remarkably improved accordingly.

When the first composite nitride layer is formed by the arc ion plating method, the following conditions can be employed, for example. That is, first, a target (sintering target or fusing target) including Al, Ti, and Ta is set to an arc type evaporation source in the apparatus, the substrate temperature is set to 400 to 600° C., and a gas pressure in the apparatus is set to 1 to 10 Pa. As the above-described gas, mixed gas of nitrogen gas and argon gas is introduced, for example. When forming a carbonitride on the substrate, methane gas may be further included in the mixed gas. Then, an arc current of 100 to 180 A is supplied to a cathode electrode while changing a bias voltage of the substrate (negative) set in the apparatus in a range of −50 to −150 V so as to increase the absolute value of the voltage. Thus, by supplying the arc current in this way, metal ions or the like are generated from the arc type evaporation source, whereby the first composite nitride layer can be formed. Examples of the apparatus used for the arc ion plating method include AIP-S40 (trademark) provided by Kobe Steel, and the like.

Examples of the composition of the target used to form the first composite nitride layer includes Al (0.4 to 0.6 atom %), Ti (0.35 to 0.59 atom %), and Ta (0.1 to 0.5 atom %).

<Second Coating Step>

In the second coating step, at least a portion of the flank face is coated with the second composite nitride layer. Here, "at least a portion of the flank face" includes region d2 located on flank face 1b and sandwiched between ridgeline AB at which rake face 1a and flank face 1b cross each other and imaginary line D2 separated by 200 μm from ridgeline AB (for example, FIG. 6).

In one aspect of the present embodiment, the expression "at least a portion of the flank face" includes region d2 located on flank face 1b and sandwiched between boundary line BB between flank face 1b and cutting edge face 1c and imaginary line D2 separated by 200 μm from imaginary ridgeline AB' (for example, FIG. 3 to FIG. 5).

A method for coating at least a portion of the flank face with the second composite nitride layer is not limited particularly; however, the second composite nitride layer can be formed by a physical vapor deposition method, for example. As with the first coating step, as the physical vapor deposition method, a conventionally known physical vapor deposition method can be used without a particular limitation.

In one implementation of the present embodiment, as the physical vapor deposition method, a cathode arc ion plating method can be used.

Examples of the composition of the target used to form the second composite nitride layer include Al (0.45 to 0.65 atom %), Ti (0.25 to 0.5 atom %), and Ta (0.055 to 0.1 atom %).

Here, the first coating step and the second coating step may be performed simultaneously, or the second coating step may be performed after performing the first coating step. Moreover, the first coating step may be performed after performing the second coating step.

Figure 10:
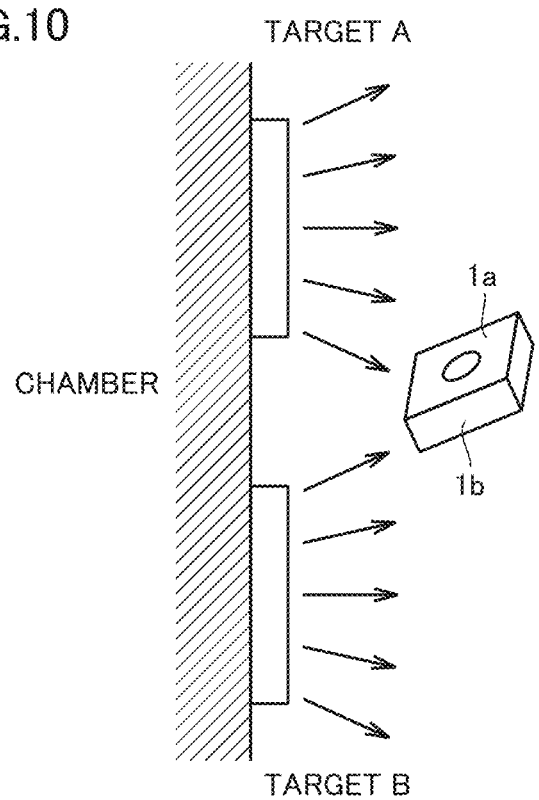
FIG. 10 is a schematic view illustrating one implementation of a film forming method used in a method for manufacturing the surface-coated cutting tool according to the present embodiment.

For example, when the first coating step and the second coating step are performed simultaneously, the following method is employed. That is, as shown in FIG. 10, first, a target A corresponding to the first composite nitride layer and a target B corresponding to the second composite nitride layer are placed at different locations. Next, the substrate (substrate having the shape of the indexable cutting insert as shown in FIG. 1, for example) is installed such that rake face 1a faces target A and flank face 1b faces target B. Then, the first coating step and the second coating step are performed simultaneously. More specifically, first, target A is installed at an upper portion and target B is installed at a lower portion on the same wall surface of the chamber used for film forming. Next, the substrate is installed such that rake face 1a faces target A and flank face 1b faces target B with each of rake face 1a and flank face 1b having an angle of 45° with respect to the wall surface of the chamber. Then, film forming is performed. When also forming the first composite nitride layer on the other rake face 1a, the direction of the substrate may be changed such that the other rake face 1a faces target A, and then film forming may be performed by the same method as described above.

Figure 11:
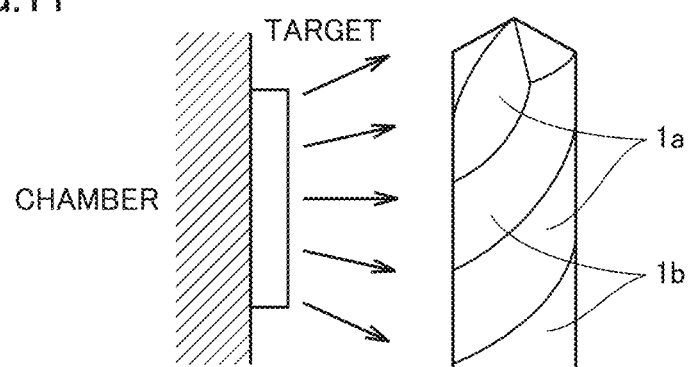
FIG. 11 is a schematic view illustrating another implementation of the film forming method used in the method for manufacturing the surface-coated cutting tool according to the present embodiment.

Moreover, when the second coating step is performed after performing the first coating step, first, outer circumference portion 1b is coated by applying, to outer circumference portion 1b of the rotary tool serving as the substrate, a masking agent or a commercially available correction fluid usable as a masking agent as shown in FIG. 11. Then, the first composite nitride layer is formed on groove portion 1a using target A (first coating step). Next, the masking agent on outer circumference portion 1b is removed using a dedicated remover or a solvent such as alcohol or acetone. Then, groove portion 1a is coated by applying, to groove portion 1a, a masking agent or a commercially available correction fluid usable as a masking agent. Then, the second composite nitride layer is formed on outer circumference portion 1b using target B (second coating step). Finally, the masking agent on groove portion 1a is removed using a dedicated remover or a solvent such as alcohol or acetone. Also when the first coating step is performed after performing the second coating step, the same method as described above can be employed.

In the manufacturing method according to the present embodiment, as described above, the composite nitride layers having different Ta concentrations are separately formed on the rake face and the flank face, respectively. Therefore, the composite nitride layers conforming to the respective characteristics required for the rake face and the flank face can be formed. That is, with the above configuration, in accordance with the manufacturing method according to the present embodiment, a surface-coated cutting tool including both a rake surface having excellent hardness and toughness and a flank face having an excellent hardness can be manufactured.

<Other Step(s)>

In the manufacturing method according to the present embodiment, in addition to the steps described above, a step of forming the other layer(s) and/or the like may be performed appropriately. When the above-described other layer(s) are formed, the other layer(s) may be formed by a conventional method.

<Clause>

The above description includes embodiments described below.

(Clause 1)

A surface-coated cutting tool comprising:

a substrate including a rake face, a flank face and a cutting edge portion that connects the rake face to the flank face;

a first coating film that coats the rake face; and a second coating film that coats the flank face, wherein the first coating film includes a first composite nitride layer at a region d1 on the rake face, the region d1 being a region sandwiched between a ridgeline at which the rake face crosses the flank face and an imaginary line D1 separated by 200 μm from the ridgeline, the second coating film includes a second composite nitride layer at a region d2 on the flank face, the region d2 being a region sandwiched between the ridgeline and an imaginary line D2 separated by 200 μm from the ridgeline, the first composite nitride layer includes $Ti_{1-x1-y1}Al_{x1}Ta_{y1}C_{\alpha1}N_{\beta1}$, where each of x1, y1, α1 and β1 represents an atomic ratio, x1 satisfies $0.4 \leq x1 \leq 0.6$, y1 satisfies $0.01 \leq y1 \leq 0.05$, α1 satisfies $0 \leq \alpha1 \leq 0.4$, α1+β1 satisfies $0.8 \leq \alpha1+\beta1 \leq 1.2$, and the second composite nitride layer includes $Ti_{1-x2-y2}Al_{x2}Ta_{y2}C_{\alpha2}N_{\beta2}$, where each of x2, y2, α2 and β2 represents an atomic ratio, x2 satisfies $0.45 \leq x2 \leq 0.65$, y2 satisfies $0.05 < y2 \leq 0.1$, α2 satisfies $0 \leq \alpha2 \leq 0.4$, and α2+β2 satisfies $0.8 \leq \alpha2+\beta2 \leq 1.2$.

EXAMPLES

While the present invention will be described in detail with reference to Examples, the present invention is not limited thereto.

<<Production of Surface-Coated Cutting Tool>>

<Substrate Preparing Step>

First, as the substrate preparing step, a carbide ball end mill in JIS "GSXB20300" (φ6) (trademark: GSXB20300 provided by Sumitomo Electric Hardmetal; non-coated) was prepared as a substrate.

<First Coating Step>

As the first coating step, the arc ion plating method was used to form the first composite nitride layer on the groove portion (rake face) of the substrate. Specifically, the following method was performed. First, the outer circumference portion (flank face) of the substrate is coated by applying a masking agent to the outer circumference portion. Then, the substrate was set in an arc ion plating apparatus (trademark: AIP-S40 provided by Kobe Steel). Next, a target (sintering target or fusing target) including metal elements at composition ratios described in the column "Composition Ratio of First Coating Film on Rake Face" in each of Tables 1 to 3 was set in an arc type evaporation source in the apparatus. On this occasion, a substrate temperature was set to 400 to 600° C., and a gas pressure in this apparatus was set to 1.0 to 10.0 Pa. In the case of forming a layer of nitride, mixed gas of nitrogen gas and argon gas was introduced as the above-described gas. In the case of forming a layer of carbonitride, mixed gas of nitrogen gas, methane gas and argon gas was introduced as the above-described gas. Then, an arc current of 100 to 180 A was supplied to a cathode electrode while changing a substrate (negative) bias voltage in a range of −50 to −150 V so as to increase the absolute value of the voltage. By supplying the arc current in this way, metal ions or the like were generated from the arc type evaporation source, whereby the first coating film constituted of the first composite nitride layer was formed. After forming the first coating film, the masking agent that coated the outer circumference portion was removed by a dedicated remover.

<Second Coating Step>

As the second coating step, the arc ion plating method was used to form the second composite nitride layer on the outer circumference portion (flank face) of the substrate. Specifically, the following method was performed. First, the groove portion (rake face) of the substrate was coated by applying a masking agent to the groove portion. Then, the substrate was set in the arc ion plating apparatus. Next, a target (sintering target or fusing target) including metal elements at composition ratios described in the column "Composition Ratio of Second Coating Film on Flank Face" in each of Tables 1 to 3 was set in an arc type evaporation source in the apparatus. On this occasion, a substrate temperature was set to 400 to 600° C., and a gas pressure in this apparatus was set to 1.0 to 10.0 Pa. In the case of forming a layer of nitride, mixed gas of nitrogen gas and argon gas was introduced as the above-described gas.

In the case of forming a layer of carbonitride, mixed gas of nitrogen gas, methane gas and argon gas was introduced as the above-described gas. Then, an arc current of 100 to 180 A was supplied to the cathode electrode while changing a substrate (negative) bias voltage in a range of −50 to −150 V so as to increase the absolute value of the voltage. By supplying the arc current in this way, metal ions or the like were generated from the arc type evaporation source, whereby the second coating film constituted of the second composite nitride layer was formed. After forming the second coating film, the masking agent that coated the groove portion was removed by a dedicated remover.

<<Evaluations on Characteristics of Cutting Tool>>

Each characteristic of the cutting tool was evaluated as described below using cutting tools of samples (samples No. 1-1 to No. 1-7, No. 2-1 to No. 2-7, No. 3-1 to No. 3-7, No. 4-1 to No. 4-7, No. 5-1, and No. C-1 to No. C-3) produced as described above.

(Evaluation on Composition of Coating Film)

The compositions of the first coating film (the first composite nitride layer) and the second coating film (the second composite nitride layer) were measured under below-described conditions using the above-described samples by an EDX apparatus (trademark: JED-2300 Analysis Station Plus provided by JEOL) accompanied with a SEM. With reference to a specific example, first, based on the cross section (for example, FIG. 8A) taken along a plane perpendicular to the rotation axis of each of the above-described samples (rotary tools), EDX measurement was performed at three arbitrary points in region d1 located on the above-described groove portion (rake face) and sandwiched between the ridgeline at which the groove portion and the outer circumference portion (flank face) cross each other and imaginary line D1 separated by 200 μm from the ridgeline along the surface of the groove portion. Then, respective average values of atom % of Al, Ti, and Ta were found. It should be noted that in the case of samples No. C-2 and No. C-3, respective average values of atom % of Si and Cr were calculated instead of Ta. Here, the "three arbitrary points" were selected from different crystal grains in the first composite nitride layer. Next, based on the average value of atom % thereof, respective composition ratios of Al, Ti, and Ta (Si in the case of sample No. C-2 and Cr in the case of sample No. C-3) were found. Moreover, respective composition ratios of N and C, which are non-metal elements, were also found by the same method. Results thereof are shown in Tables 1 to 3.

In Tables 1 to 3, the numerical characters described in the columns "Composition Ratio of First Coating Film" and "Composition Ratio of Second Coating Film" represent respective composition ratios of the elements. Moreover, an element for which no numerical character is described indicates that the composition ratio of the element is 1. For example, the description "Ti0.50Al0.50N" means that each of the composition ratios of the Ti element and the Al element is 0.50 and the composition ratio of the N element is 1.

Measurement Conditions in EDX Method

Acceleration voltage: 15 kV

Illumination current: 70 μA

Elements to be measured: Al, Ti, Ta, C, and N

Number of times of performing integration: 20 times (Measurement of Film Thickness)

Each of the thicknesses of the first coating film (first composite nitride layer) and the second coating film (second composite nitride layer) was found by: performing measurement at arbitrary three points in a cross sectional sample parallel to the normal direction of the surface of the substrate using a scanning electron microscope (SEM) (trademark: JSM-IT300 provided by JEOL); and calculating an average value of the measured thicknesses at the three points. Results thereof are shown in Tables 1 to 3. Each of numerical values in the column "Film Thickness" in each of Tables 1 to 3 represents an average value of the film thickness of the coating film on the rake face and the film thickness of the coating film on the flank face.

Measurement Conditions in SEM Method

Acceleration voltage: 10 kV

Illumination current: 40 μA

Magnification: 10,000×

<<Cutting Test>>

<Breakage Resistance Test and Wear Resistance Test>

Breakage resistance and wear resistance were evaluated by performing the cutting test in accordance with below-described cutting conditions using the cutting tools of the samples (samples No. 1-1 to No. 1-7, No. 2-1 to No. 2-7, No. 3-1 to No. 3-7, No. 4-1 to No. 4-7, No. 5-1, and No. C-1 to No. C-3) produced as described above. Specifically, the breakage resistance and wear resistance were evaluated by checking a state of the cutting edge after cutting a workpiece by 10 m. Results thereof are shown in Tables 1 to 3. In this cutting test, samples No. 1-2 to No. 1-6, No. 2-2 to No. 2-6, No. 3-2 to No. 3-6, No. 4-2 to No. 4-6, and No. 5-1 are samples of Examples of the present disclosure, whereas the samples other than these are samples of Comparative Examples. That is, samples No. 1-1, No. 1-7, No. 2-1, No. 2-7, No. 3-1, No. 3-7, No. 4-1, No. 4-7, and No. C-1 to No. C-3 are samples of the Comparative Examples.

In the column "Breakage Resistance" of each of Tables 1 to 3, "Normal Wear" means that only wear of the flank face was observed to confirm no chipping of the coating films. Moreover, in the column of "Crater Wear of Rake Face", "Large Wear" means that the wear width of the crater wear was more than or equal to 100 μm. "Small Wear" means that the wear width of the crater wear was less than or equal to 80 μm. In this cutting test, a sample with no film chipping can be evaluated as a cutting tool having an excellent breakage resistance. Moreover, a sample with a small crater wear in the rake face can be evaluated as a cutting tool having an excellent wear resistance. A sample with a small flank face wear amount can be evaluated as a cutting tool having a more excellent wear resistance.

(Cutting Conditions in Breakage Resistance Test—Ball End Mill)

Workpiece (material): Inconel 718

Speed (Vc): 45 m/min

Feed (fz): 0.05 mm/t

Cut: ap 0.5 mm, ae 0.3 mm

Externally supplied oil: supplied (water soluble)

TABLE 1

| Sample No. | Composition Ratio of First Coating Film on Rake Face | Composition Ratio of Second Coating Film on Flank Face | Film Thickness (μm) | Film Forming Time (min) | Breakage Resistance | Crater Wear of Rake Face | Flank Face Wear Amount (μm) |
|---|---|---|---|---|---|---|---|
| Ta Composition Ratio of First Coating Film on Rake Face is Changed. | | | | | | | |
| 1-1 | Ti0.50Al0.50N | Ti0.35Al0.57Ta0.08N | 2 | 50 | Normal Wear | Large Wear | 85 |
| 1-2 | Ti0.52Al0.47Ta0.01N | Ti0.35Al0.57Ta0.08N | 2 | 50 | Normal Wear | Small Wear | 73 |
| 1-3 | Ti0.52Al0.46Ta0.02N | Ti0.35Al0.57Ta0.08N | 2 | 50 | Normal Wear | Small Wear | 72 |
| 1-4 | Ti0.52Al0.45Ta0.03N | Ti0.35Al0.57Ta0.08N | 2 | 50 | Normal Wear | Small Wear | 68 |
| 1-5 | Ti0.51Al0.45Ta0.04N | Ti0.35Al0.57Ta0.08N | 2 | 50 | Normal Wear | Small Wear | 69 |
| 1-6 | Ti0.51Al0.44Ta0.05N | Ti0.35Al0.57Ta0.08N | 2 | 50 | Normal Wear | Small Wear | 66 |
| 1-7 | Ti0.50Al0.43Ta0.07N | Ti0.35Al0.57Ta0.08N | 2 | 50 | Occurrence of Film Chipping | Small Wear | 95 |
| Al Composition Ratio of First Coating Film on Rake Face is Changed. | | | | | | | |
| 2-1 | Ti0.62Al0.35Ta0.03N | Ti0.40Al0.52Ta0.08N | 2.5 | 62 | Normal Wear | Large Wear | 82 |
| 2-2 | Ti0.57Al0.40Ta0.03N | Ti0.40Al0.52Ta0.08N | 2.5 | 62 | Normal Wear | Small Wear | 75 |
| 2-3 | Ti0.52Al0.45Ta0.03N | Ti0.40Al0.52Ta0.08N | 2.5 | 62 | Normal Wear | Small Wear | 71 |
| 2-4 | Ti0.47Al0.50Ta0.03N | Ti0.40Al0.52Ta0.08N | 2.5 | 62 | Normal Wear | Small Wear | 68 |
| 2-5 | Ti0.42Al0.55Ta0.03N | Ti0.40Al0.52Ta0.08N | 2.5 | 62 | Normal Wear | Small Wear | 72 |
| 2-6 | Ti0.37Al0.60Ta0.03N | Ti0.40Al0.52Ta0.08N | 2.5 | 62 | Normal Wear | Small Wear | 69 |
| 2-7 | Ti0.32Al0.65Ta0.03N | Ti0.40Al0.52Ta0.08N | 2.5 | 62 | Normal Wear | Large Wear | 78 |

TABLE 2

| Sample No. | Composition Ratio of First Coating Film on Rake Face | Composition Ratio of Second Coating Film on Flank Face | Film Thickness (μm) | Film Forming Time (min) | Breakage Resistance | Crater Wear of Rake Face | Flank Face Wear Amount (μm) |
|---|---|---|---|---|---|---|---|
| Ta Composition Ratio of Second Coating Film on Flank Face is Changed. | | | | | | | |
| 3-1 | Ti0.50Al0.47Ta0.03N | Ti0.37Al0.60Ta0.03N | 2 | 50 | Normal Wear | Small Wear | 91 |
| 3-2 | Ti0.50Al0.47Ta0.03N | Ti0.36Al0.58Ta0.06N | 2 | 50 | Normal Wear | Small Wear | 75 |
| 3-3 | Ti0.50Al0.47Ta0.03N | Ti0.35Al0.58Ta0.07N | 2 | 50 | Normal Wear | Small Wear | 70 |
| 3-4 | Ti0.50Al0.47Ta0.03N | Ti0.35Al0.57Ta0.08N | 2 | 50 | Normal Wear | Small Wear | 68 |
| 3-5 | Ti0.50Al0.47Ta0.03N | Ti0.34Al0.57Ta0.09N | 2 | 50 | Normal Wear | Small Wear | 66 |
| 3-6 | Ti0.50Al0.47Ta0.03N | Ti0.34Al0.56Ta0.10N | 2 | 50 | Normal Wear | Small Wear | 62 |
| 3-7 | Ti0.50Al0.47Ta0.03N | Ti0.32Al0.55Ta0.13N | 2 | 50 | Occurrence of Film Chipping | Small Wear | 113 |
| Al Composition Ratio of Second Coating Film on Flank Face is Changed. | | | | | | | |
| 4-1 | Ti0.55Al0.42Ta0.03N | Ti0.52Al0.40Ta0.08N | 2 | 50 | Normal Wear | Small Wear | 94 |
| 4-2 | Ti0.55Al0.42Ta0.03N | Ti0.47Al0.45Ta0.08N | 2 | 50 | Normal Wear | Small Wear | 70 |
| 4-3 | Ti0.55Al0.42Ta0.03N | Ti0.42Al0.50Ta0.08N | 2 | 50 | Normal Wear | Small Wear | 67 |
| 4-4 | Ti0.55Al0.42Ta0.03N | Ti0.37Al0.55Ta0.08N | 2 | 50 | Normal Wear | Small Wear | 64 |
| 4-5 | Ti0.55Al0.42Ta0.03N | Ti0.32Al0.60Ta0.08N | 2 | 50 | Normal Wear | Small Wear | 66 |
| 4-6 | Ti0.55Al0.42Ta0.03N | Ti0.27Al0.65Ta0.08N | 2 | 50 | Normal Wear | Small Wear | 75 |
| 4-7 | Ti0.55Al0.42Ta0.03N | Ti0.22Al0.70Ta0.08N | 2 | 50 | Normal Wear | Small Wear | 128 |

TABLE 3

| Sample No. | Composition Ratio of First Coating Film on Rake Face | Composition Ratio of Second Coating Film on Flank Face | Film Thickness (μm) | Film Forming Time (min) | Breakage Resistance | Crater Wear of Rake Face | Flank Face Wear Amount (μm) |
|---|---|---|---|---|---|---|---|
| 5-1 | Ti0.52Al0.45Ta0.03 (C0.3N0.7) | Ti0.35Al0.57Ta0.08 (C0.3N0.7) | 2 | 50 | No Chipping | Small Wear | 66 |
| C-1 | Ti0.50Al0.50N | Ti0.50Al0.50N | 2 | 50 | No Chipping | Large Wear | 129 |
| C-2 | Ti0.52Al0.45Si0.03N | Ti0.35Al0.57Si0.08N | 2 | 50 | Occurrence of Chipping | Large Wear | 105 |
| C-3 | Ti0.52Al0.45Cr0.03N | Ti0.35Al0.57Cr0.08N | 2 | 50 | No Chipping | Large Wear | 110 |

In view of the results of the above-described cutting test, it was understood that each of the cutting tools according to the Examples of the present disclosure (the cutting tools according to samples No. 1-2 to No. 1-6, No. 2-2 to No. 2-6, No. 3-2 to No. 3-6, No. 4-2 to No. 4-6, and No. 5-1) has a more excellent breakage resistance and an excellent wear resistance (crater wear resistance and flank face wear resistance) than those of the cutting tools of the Comparative Examples.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: substrate; 2: cutting portion; 3: shank; 4: end cutting edge portion; 1a: rake face or groove portion; 1b: flank face or outer circumference portion; 1c: cutting edge face; 10: cutting tool; 11a: first coating film; 11b: second coating film; AA: boundary line; AB: ridgeline; AB': imaginary ridgeline; BB: boundary line; D1, D2: imaginary line; d1: region sandwiched between boundary line AA and imaginary line D1 (or region sandwiched between ridgeline AB and imaginary line D1); d2: region sandwiched between boundary line BB and imaginary line D2 (or region sandwiched between ridgeline AB and imaginary line D2).

The invention claimed is:

1. A surface-coated cutting tool comprising:
a substrate including a rake face and a flank face;
a first coating film that coats the rake face; and
a second coating film that coats the flank face, wherein
the first coating film includes a first composite nitride layer at a region d1 on the rake face,
the second coating film includes a second composite nitride layer at a region d2 on the flank face,
The first composite nitride layer includes $Ti_{1-x1-y1}Al_{x1}Ta_{y1}C_{\alpha 1}N_{\beta 1}$, where each of x1, y1, α1 and β1 represents an atomic ratio, x1 satisfies 0.4≤x1≤0.6, y1 satisfies 0.01<y1<0.05, α1 satisfies 0≤α1≤0.4, α1+β1 satisfies 0.8≤α1'β1≤1.2,
the second composite nitride layer includes $Ti_{1-x2-y2}Al_{x2}Ta_{y2}C_{\alpha 2}N_{\beta 2}$, where each of x2, y2, α2 and β2 represents an atomic ratio, x2 satisfies 0.45<x2<0.65, y2 satisfies 0.05≤y2≤0.1, α2 satisfies 0≤α2≤0.4, and α2+β2 satisfies 0.8≤α2+β2<1.2,
in a case where the rake face and the flank face are connected via a cutting edge face, the region d1 is a region sandwiched between a boundary line between the rake face and the cutting edge face and an imaginary line D1 located on the rake face and separated by 200 μm from an imaginary ridgeline at which a plane obtained by extending the rake face crosses a plane obtained by extending the flank face, and the region d2 is a region sandwiched between a boundary line between the flank face and the cutting edge face and an imaginary line D2 located on the flank face and separated by 200 μm from the imaginary ridgeline, and in a case where the rake face and the flank face are connected via a ridgeline, the region d1 is a region sandwiched between the ridgeline and the imaginary line D1 located on the rake face and separated by 200 μm from the ridgeline, and the region d2 is a region sandwiched between the ridgeline and the imaginary line D2 located on the flank face and separated by 200 μm from the ridgeline.

2. The surface-coated cutting tool according to claim 1, wherein y1 satisfies $0.03 \leq y1 \leq 0.05$.

3. The surface-coated cutting tool according to claim 1, wherein y2 satisfies $0.08 \leq y2 \leq 0.1$.

4. The surface-coated cutting tool according to claim 1, wherein x1 satisfies $0.4 \leq x1 \leq 0.5$.

5. The surface-coated cutting tool according to claim 1, wherein x2 satisfies $0.55 \leq x2 \leq 0.65$.

6. The surface-coated cutting tool according to claim 1, wherein each of the first coating film and the second coating film has a thickness of more than or equal to 1 μm and less than or equal to 10 μm.

7. The surface-coated cutting tool according to claim 1, wherein the substrate includes at least one selected from a group consisting of a cemented carbide, a cermet, a high-speed steel, a ceramic, a cBN sintered material, and a diamond sintered material.

* * * * *